United States Patent [19]

Yoshida et al.

[11] Patent Number: 5,128,736
[45] Date of Patent: Jul. 7, 1992

[54] LIGHT SENSITIVE SEMICONDUCTOR DEVICE

[75] Inventors: Eiichi Yoshida; Tomoyoshi Zenki; Satoru Murakami, all of Kobe; Minori Yamaguchi, Akashi; Takehisa Nakayama; Yoshihisa Tawada, both of Kobe, all of Japan

[73] Assignee: Kanegafuchi Chemical Industry Co., Ltd., Osaka, Japan

[21] Appl. No.: 649,294

[22] Filed: Jan. 30, 1991

Related U.S. Application Data

[63] Continuation of Ser. No. 295,706, Jan. 11, 1989, abandoned.

[30] Foreign Application Priority Data

Jan. 12, 1988 [JP] Japan ................. 63-005481

[51] Int. Cl.$^5$ ............................. H01L 27/14
[52] U.S. Cl. ...................... 357/30; 357/32; 136/244
[58] Field of Search ............ 357/30 R, 32, 30 H, 357/30 K, 24 LR, 31; 250/553, 206, 211 R, 206.1; 136/256, 244; 307/311

[56] References Cited

U.S. PATENT DOCUMENTS 4,547,074 10/1985 Hinoda et al. ................ 357/32 X
4,805,006 2/1989 Yamaguchi et al. ......... 357/32 X
4,918,506 4/1990 Dyck ............................ 357/30

FOREIGN PATENT DOCUMENTS 0121982 7/1984 Japan.

Primary Examiner—Andrew J. James
Assistant Examiner—Roy Potter
Attorney, Agent, or Firm—Wegner, Cantor, Mueller & Player

[57] ABSTRACT

In a light sensitive semiconductor unit having a plurality of light sensitive semiconductor cells connected in series, the light receiving area or size of the light sensitive semiconductor cells is increased as the distance from the center of the unit increases so that every light sensitive semiconductor cell can generate generally equal short circuit current even if the light intensity is decreased as the distance between the light sensitive semiconductor cell and light source increases, whereby a high operating voltage can be obtained.

6 Claims, 5 Drawing Sheets

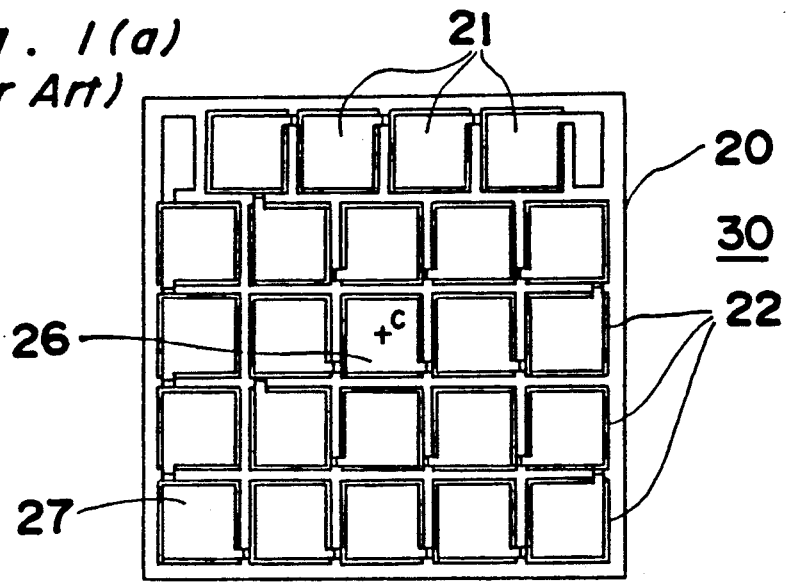
Fig. 1(a) (Prior Art)
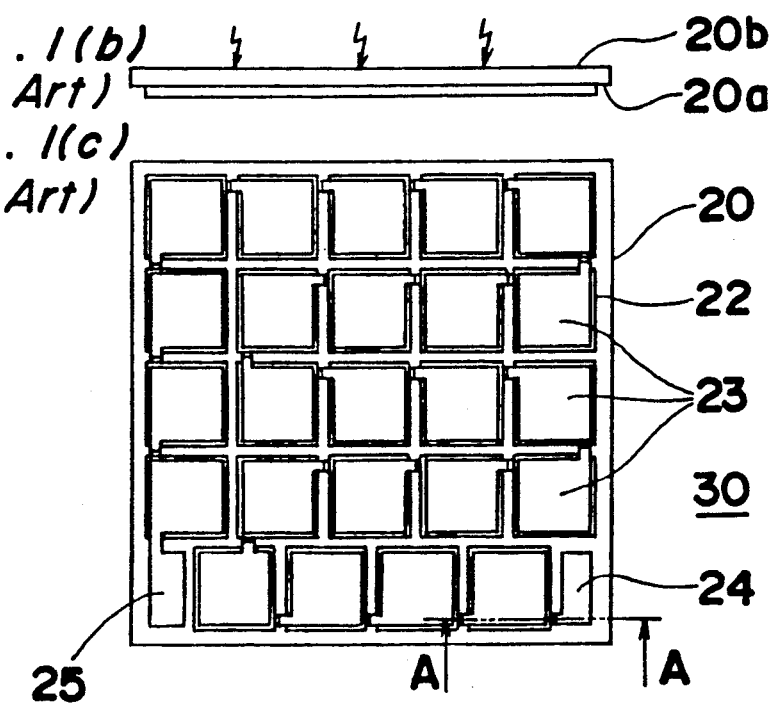
Fig. 1(b) (Prior Art)
Fig. 1(c) (Prior Art)

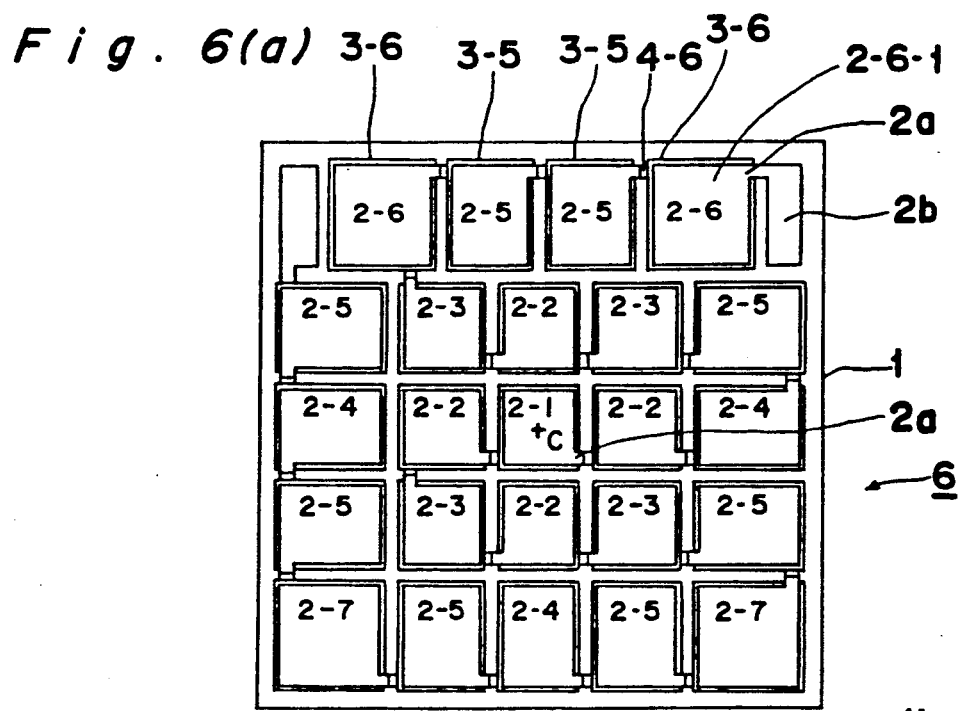
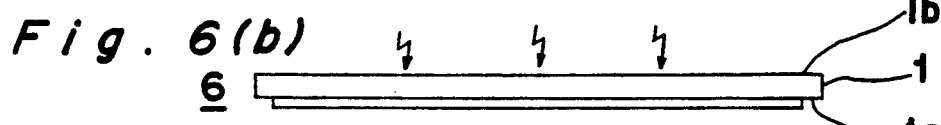
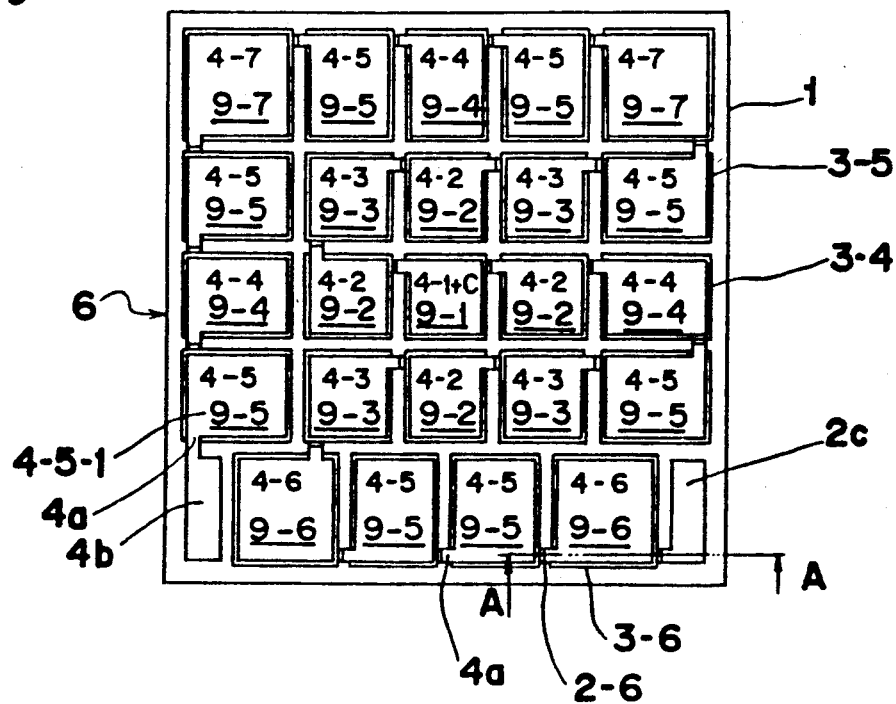

LIGHT SENSITIVE SEMICONDUCTOR DEVICE

This application is a continuation of U.S. application Ser. No. 07/295,706 filed Jan. 11, 1989.

BACKGROUND OF THE INVENTION

1. Field of the invention

The present invention relates to a light sensitive semiconductor device and/or light sensitive semiconductor unit and more particularly to a light sensitive semiconductor device and/or light sensitive semiconductor unit used for supplying electric signal to driver semiconductor elements such as light sensitive semiconductor switches or light sensitive semiconductor relays.

2. Description of the Prior Art

It has been well known to use a light sensible semiconductor switch employing one or more MOS field effect transistor (referred to as FET). In the conventional light sensitive semiconductor switch, there is employed a light sensitive semiconductor cell which generates an electric power by receiving light emitted from a light source such as a light emitting diode (referred to as LED). As the light sensitive semiconductor cell, poly silicon semiconductor, single crystal silicon semiconductor or amorphous semiconductor are used. The following explanation is made with reference to the light sensitive semiconductor unit made of amorphous semiconductor material.

It is noted that in the disclosure, the term "light sensitive semiconductor cell" generally means an assembly of a light sensitive semiconductor element with a pair of connecting electrodes, the term "light sensitive semiconductor unit" generally means an assembly of a number of light sensitive semiconductor cells formed on a substrate and the term "light sensitive semiconductor device" means an assembly of the light sensitive semiconductor unit and other elements such as LED or the like.

Referring to FIGS. 1a to 1c, twenty four lower electrodes 21 each made of a transparent electrically conductive film such as indium tin oxide (ITO) or tin oxide (Sn O$_2$) are disposed in a matrix shape on a top surface 20a of an insulation substrate 20 having a rectangular shape of about 1 to 5 mm wide. Each of lower electrodes 21 is electrically insulated. A light sensitive semiconductor element 22 is formed on the upper surface of every lower electrodes 21. On the upper surface of each semiconductor element 22, an upper electrode 23 made of metal such as aluminum is formed. By the arrangement mentioned above, there are formed 24 light sensitive semiconductor cells on the substrate 20. Each of the light sensitive semiconductor cells has an equal light receiving area. Moreover, each of the light sensitive semiconductor cells has its projecting portion of the upper electrode electrically connected to the lower electrode of the adjacent cell so that 24 light sensitive semiconductor cells can be electrically serially connected. The respective light sensitive semiconductor cells are coated with a protecting film made of electrical insulation material.

The light sensitive semiconductor unit 30 in which 24 light sensitive semiconductor cells are arranged as mentioned above is disposed in such a manner that the center C of the unit 30 opposed to a light source 7 or 8 (see FIGS. 2a or 2b) with a separation about 0.5 mm to several millimeters. The light from the light source 6 is illuminated on the surface of the substrate 20 and, the light reaches the respective semiconductor elements 22 passing through the lower electrodes 21. Upon receiving the light, the light sensitive semiconductor unit 30 generates electrical power and the generated electrical powers are serially added and taken out from the terminals 24 and 25.

Since the rays of light from the light source such as LED are not parallel, the light intensity received by the respective light sensitive semiconductor cells is not uniform. In general, in the case where LED is disposed so it faces the center of the light sensitive semiconductor unit 30, the light intensity is strongest at the center C of the unit 30 and the light intensity becomes lower as the distance from the center C increases. Therefore, in the conventional light sensitive semiconductor device as shown in FIGS. 1a to 1c, since the light receiving area of the respective light sensitive semiconductor cells is substantially equal, the electric power generated at the central cell 26 and that generated at the cells 27 situated at the respective corners are different depending on the intensity of the light incident to the respective light sensitive semiconductor cells. That is, if the light intensity received by the cell 27 is a half of the light received by the cell 26, the power generated at the cell 27 is a half of the power generated at the cell 26. In the case where the light sensitive semiconductor device is formed by connecting a number of the light sensitive semiconductor cells in series, nonuniform light intensity as mentioned above causes a problem in the light sensitive semiconductor device. Referring to FIG. 3 showing a general characteristics of the light sensitive semiconductor unit 30, wherein Isc is a short circuit current of the light sensitive semiconductor unit and Voc is an open circuit voltage of the light sensitive semiconductor unit. The short circuit current Isc is generally proportional to the light intensity of the light source in the case where the light receiving area of the light sensitive semiconductor cell is the same at any position on the cell. On the other hand, the open circuit voltage Voc scarcely changes irrespective of change of the light intensity of the light source. Substantially similar characteristics can be obtained for the light sensitive semiconductor unit in which a number of the light sensitive semiconductor cells are serially connected. However, the short circuit current Isc is defined by the light receiving area of the single light sensitive semiconductor cell and the open voltage is defined by the open voltage Voc × number of the stages of the cells. In the conventional light sensitive semiconductor unit having semiconductor cells of the same light receiving areas, there can be obtained such a characteristic as shown in the dotted line in FIG. 4. In the case where the light intensity decreases as the distance from the center of the light sensitive semiconductor unit increases, the short circuit current of the light sensitive semiconductor unit 30 is defined by the short circuit current Isc2 of the semiconductor cell 27 situated at the position farthest from the center even if the short circuit current Isc1 of the central semiconductor cell 26 is greater than the short circuit current Isc2 and the characteristic curve of the light sensitive semiconductor unit is shown as the real line in FIG. 4. Under such a condition, when a load R1 is connected to the light sensitive semiconductor unit 30, the operating voltage OP2 appearing across the load is lower than the operating voltage OP1 appearing across the load when the light intensity incident to the respective light sensitive semiconductor cells is uniform.

SUMMARY OF THE INVENTION

An essential object of the present invention is to provide a light sensitive semiconductor device and/or light sensitive semiconductor unit having a plurality of light sensitive semiconductor cells serially connected in which each of the light sensitive semiconductor cells can generate uniform electric power even if the light intensity incident to the respective light sensitive semiconductor cells is not uniform.

Another object of the present invention is to provide a light sensitive semiconductor unit which can generate a high operating voltage with a small sized unit even if there is irregular light intensity.

A further object of the present invention is to provide a light sensitive semiconductor device suitable for an optical switch or optical relay operable with a high operating voltage.

According to the present invention, there is provided a light sensitive semiconductor unit having a plurality of light sensitive semiconductor cells serially connected, in which the light receiving area of the respective light sensitive semiconductor cells change corresponding to the distance from the light source.

BRIEF EXPLANATION OF THE DRAWINGS

FIG. 1a is a top plan view showing an example of a conventional light sensitive semiconductor unit, FIG. 1b is a side view of the unit shown in FIG. 1a, FIG. 1c is a bottom plan view of the unit shown in FIG. 1a, FIG. 2a is a side view showing an example of an light sensitive semiconductor device with a light source, FIG. 6b is a side view of an example of the light sensitive semiconductor unit according to the present invention, FIG. 6c is a plan view viewed from the side 1b of the substrate 1 of an embodiment of the light sensitive semiconductor unit formed on the arrangement shown in FIG. 6a, FIG. 7 is a cross sectional view showing a specific structure of the device shown in FIG. 1c.

DETAILED DESCRIPTION OF THE PREFERRED EMBODIMENTS

Figure 7:
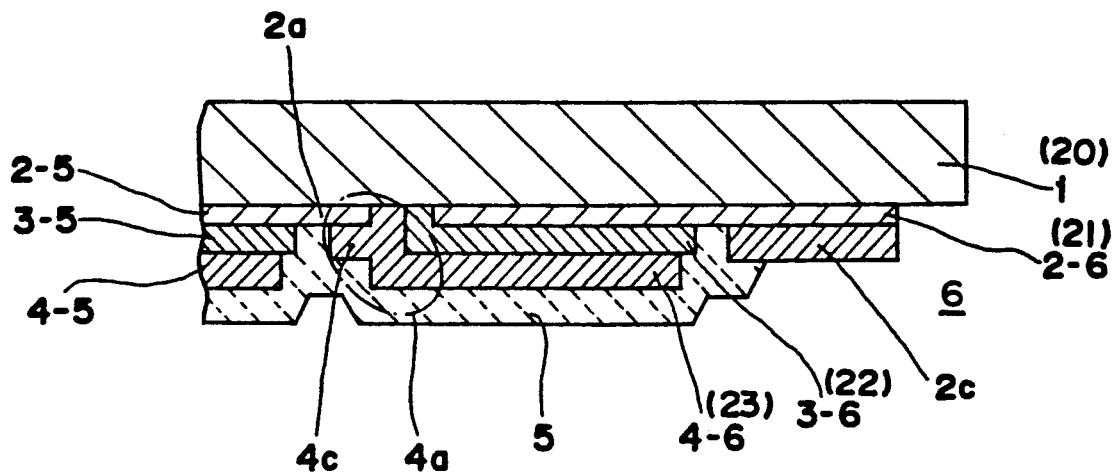

Referring to FIGS. 6a to 6c, a substrate is made of a transparent material such as a glass plate of a rectangular shape with one side of 0.5 mm to 10 mm long. At the center C of the top surface 1a of the substrate 1, there is disposed a lower electrode 2-1 of a rectangular shape made of a transparent electrical conductive film such as indium tin oxide (ITO) film or (Sn $O_2$). The lower electrode 2-1 has its one corner projected to form a connecting terminal 2a. A plurality of lower electrodes, made in a similar manner as the lower electrode 2-1 but the size of the top surface thereof is different, are disposed around the central lower electrode 2-1 in a matrix manner.

Four lower electrodes 2—2 having the same size are formed adjacent to the four sides of the central lower electrode 2-1, four lower electrodes 2—3 are formed on the extension lines of the diagonal lines of the electrode 2-1 adjacent to the lower electrodes 2—2 and moreover, three lower electrodes 2—4 are formed adjacent to the electrodes 2—2, eight lower electrodes 2—5 are formed adjacent to the lower electrodes 2-3, moreover two lower electrodes 2-6 and 2-7 are formed adjacent to the electrodes 2-5. In the arrangement mentioned above, 24 lower electrodes are formed on the top surface 1a of the substrate 1.

One of the lower electrode 2-6-1 situated at the upper right corner of the substrate is provided with a connection terminal 2b formed on the substrate 1 for extending from an electrode 2a projected from a corner of the lower electrode 2-6-1 so that the electric power generated in the light sensitive semiconductor unit 6 can be taken out to an external circuit (not shown). The surface of the connection terminal 2b is coated by an electrode 2c.

The size of the respective lower electrodes are defined in such a manner that the central electrode 2-1 is smallest and the electrodes 2-2 which are situated outside and adjacent to the central electrode 2-1 are larger than the electrode 2-1, next the electrodes 2-3 are larger than the electrodes 2-2. Similarly, the size of the lower electrodes is increased in the turn of 2-3, 2-4, 2-5, 2-6 and 2-7 and the electrodes 2-7 situated furthest from the center C of the substrate 1 are largest.

Light sensitive semiconductor layers 3-1 to 3-7 made of amorphous silicon are laid on the top surfaces of the respective lower electrodes 2-1 to 2-7 to cover the lower electrodes 2-1 to 2-7 respectively. The shape and size of the light sensitive semiconductor layers 3-1 to 3-7 are almost the same as the shape and size of the corresponding lower electrodes 2-1 to 2-7. The light sensitive semiconductor layers 3-1 to 3-7 are respectively electrically insulated each other. Moreover, upper electrodes 4-1 to 4-7 made of metal such as aluminum having the same shape and size of the corresponding lower electrodes 2-1 to 2-7 are formed on the light sensitive semiconductor layers 3-1 to 3-7.

A cross sectional structure of the light sensitive semiconductor cell can be as in FIG. 7 showing the cross sectional view taken along the lines A—A in FIG. 6C.

In the arrangement mentioned above, there are formed a plurality of light sensitive semiconductor cells 9-1 to 9-7 arranged in a matrix shape in which the light receiving area of the central light receiving cell 9-1 is smallest and the light receiving areas of the respective light sensitive semiconductor cells 9-2 to 9-7 are larger as the light sensitive semiconductor cells are situated further away from the center C of the substrate 1. The projected portion 4a of the upper electrode 4-5-1 situated at the lower left corner in FIG. 6C is expanded on the top surface 1a of the substrate 1 to form a connecting terminal 4b for introducing the electric power generated in the light sensitive semiconductor unit to an external device. Respective projections 4a of the upper electrodes 4-1 to 4-7 extend toward the substrate 1 and contact projections 4c expanded from the intermediate portion of the projections 4a are connected with the projections 2a of one of the adjacent lower electrodes 2-1 to 2-7 as shown in FIG. 7 so that the lower electrodes and upper electrodes are serially connected, whereby the light sensitive semiconductor cells are connected in series.

24 light sensitive semiconductor cells are coated by a protection layer 5 except for the connection terminal 2b of the lower electrode 2-6-1 and the connection terminal 4b of the upper electrode 4-6-1.

Figure 2A:
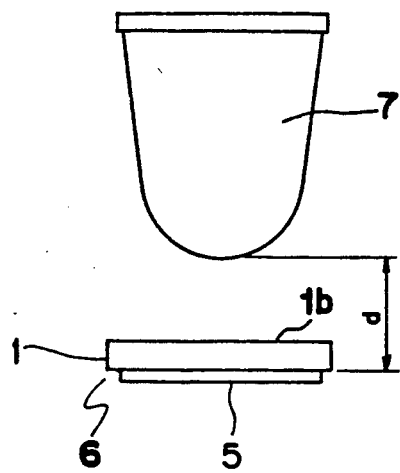
FIG. 2b is a side view showing another example of an light sensitive semiconductor device with a light source.
Figure 2B:
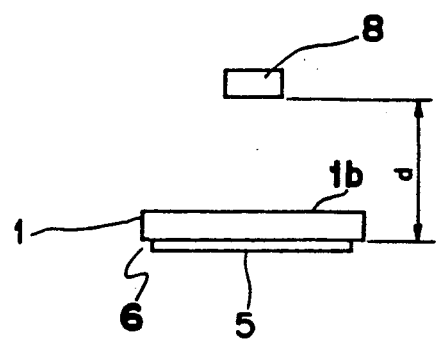
Figure 3:
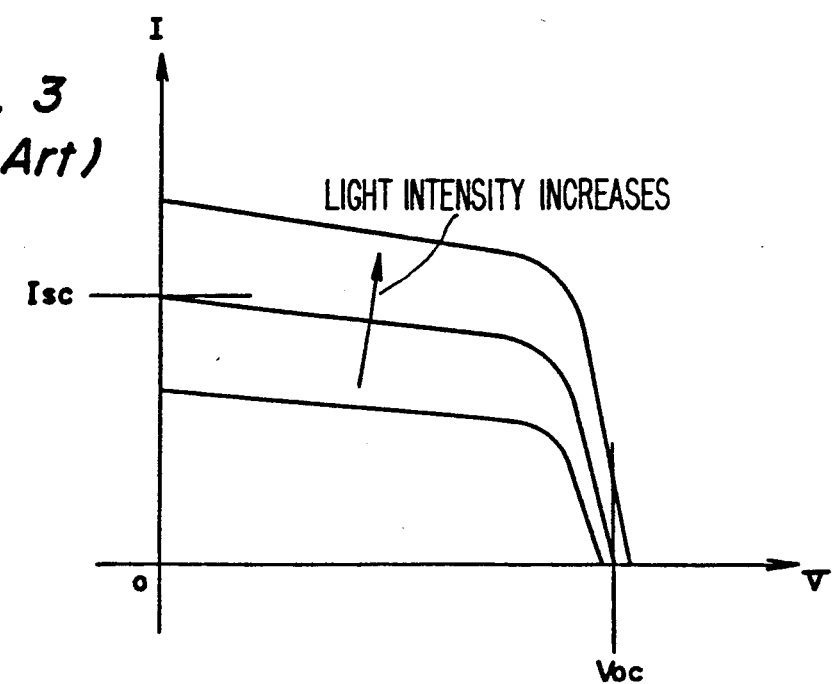
FIGS. 3 and 4 are characteristic curves of the unit shown in FIG. 1a, FIG. 5 is an equivalent circuit of the unit shown in FIG. 1a, FIG. 6a is a plan view viewed from the side 1a of the substrate 1 showing an example of an arrangement of lower electrodes on a substrate of the light sensitive semiconductor units according to the present invention
Figure 4:
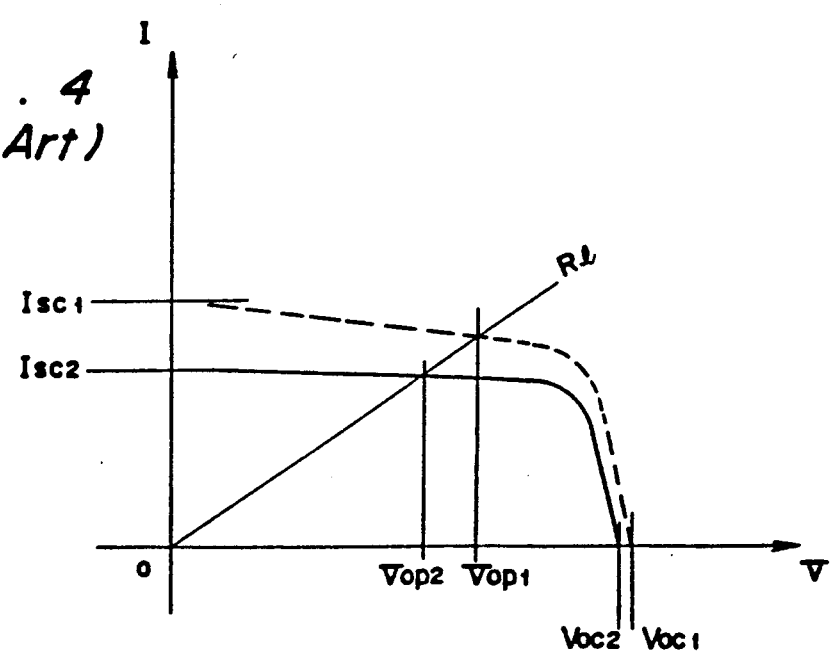
Figure 5:
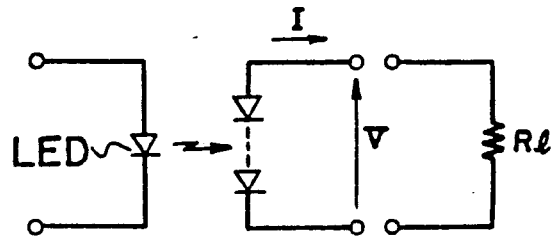

The light sensitive semiconductor unit 6 formed as mentioned above is used as a light sensitive semiconductor switch. The light sensitive semiconductor unit 6 is disposed to face the light source 7 or 8 made of LED as shown in FIGS. 2a and 2b so that the lower surface 1b of the substrate 1 is opposed to the light source 7 or 8 with the distance d of several millimeters and the light axis of the light source 7 or 8 aligns with the center C of the light sensitive semiconductor switch unit 6. The light emitted from the light source 7 (or 8) is projected to the surface 1b and passes the substrate 1 and the lower electrodes 2, then enters the light sensitive semiconductor layer 3. The reference numeral 3 represents the reference numerals 3-1, 3-2 . . . The respective light sensitive layers 3-1 to 3-7 receive the light and generate electric power proportional to the amount of the receiving light. The light intensity is highest at the center C of the light sensitive semiconductor unit 6 and becomes lower as the position is farther from the center C. In the present embodiment, since the light receiving area of the light sensitive semiconductor cell 9-1 situated at the center C is smallest and the light sensitive semiconductor cells become larger as the position of the light sensitive semiconductor cell is farther from the center C, the respective short circuit currents Isc of the respective light sensitive semiconductor cells are substantially equal. Accordingly, the short circuit current of the light sensitive semiconductor unit 6 as a whole is also Isc. By designing the short circuit current Isc high as shown in the dotted line in FIG. 4, there can be obtained a high operating voltage Vop1 against the load having a load resistance R 1 without causing the operating voltage to be lowered to Vop2 as occurred in the prior art as shown in the real line in FIG. 4. Therefore, it is an advantage of the present invention that a high operating voltage can be obtained for the light sensitive semiconductor unit 6 of the same size compared to the conventional light sensitive semiconductor unit.

In the embodiment shown in FIGS. 6a to 6c, the light receiving areas of the light sensitive semiconductor cells 9-1, 9-2 . . . 9-7 are made with the ratio of 1:1.1:1.2:1.4:1.5:1.8:2.0. However the ratio of the light receiving area of the cells may be defined as desired corresponding to the change of the light intensity. Moreover, in the present embodiment, 24 cells are connected in series and the open circuit voltage of about 12 volts can be obtained by defining the open circuit voltage of the respective cells 0.5 volts, the open circuit voltage may be selected as desired corresponding to the kind of the transistor which is driven by the light sensitive semiconductor unit, for example, there may be used a light sensitive semiconductor unit in which about six light sensitive semiconductor cells are connected in series. The number of the light sensitive semiconductor cells connected in series may be five to one hundred corresponding to the object of the light sensitive semiconductor unit. Moreover, the light sensitive semiconductor cells may be connected in parallel partially and in series.

Figure 8:
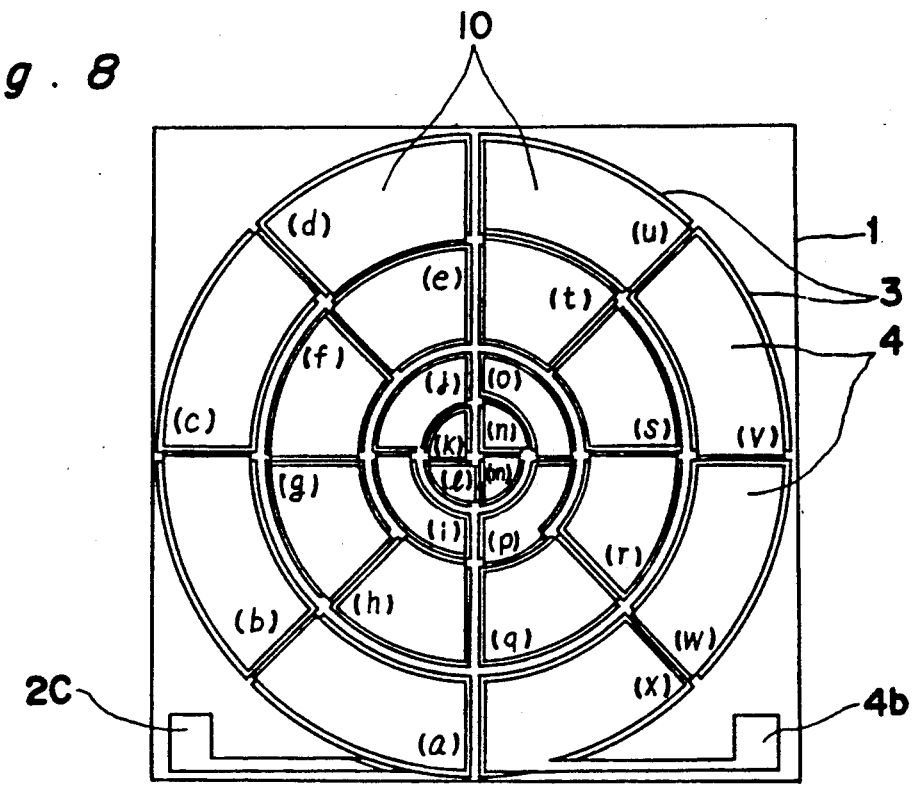
FIG. 8 is a plan view of another example of the light sensitive semiconductor unit according to the present invention.

Another embodiment of the light sensitive semiconductor unit according to the present invention is shown in FIG. 8. It is noted that in FIG. 8, like parts of the embodiment shown in FIGS. 6a to 6c are designated by like reference numerals and the detailed description thereof is herein omitted. Referring to FIG. 8, a plurality of light sensitive semiconductor cells 10 having the same structure in the vertical cross section as the structure of the light sensitive semiconductor cell shown in FIGS. 6a to 6c but having generally sector shape are formed on the substrate 1 in a coaxial and radial manner, so that there is provided a light sensitive semiconductor unit of a generally round shape. The size of the light receiving area of the light sensitive semiconductor cells 10 are defined such that the size of the light sensitive semiconductor cells increases as the distance from the center in a radial direction increases.

The respective light sensitive semiconductor cells 10 are connected in series in such a manner that the outmost light sensitive semiconductor cell (a) connected to the terminal 2C is connected to the adjacent cell (b), which is connected to the cell (c) . They are connected in the order of alphabet. The central cell (1) is connected to the adjacent cell (m), which is connected to the cell (n). The outmost cell (x) is connected to the terminal 4b. Therefore, 24 light sensitive semiconductor cells 10 are connected in series between the terminals 2c and 4b. The light sensitive semiconductor unit shown in FIG. 8 is used in such a manner that the light axis of the light source made of LED is opposed to the center C of the light sensitive semiconductor unit in a similar manner as shown in FIGS. 2a or 2b, whereby the output voltage of the light sensitive semiconductor unit can be obtained from the terminal 2c and 4b. In the present embodiment, since the light receiving area of the light sensitive semiconductor cells (k), (l), (m) and (n) situated at the center C are smallest and the light sensitive semiconductor cells become larger as the position of the light sensitive semiconductor cell is farther from the center C, the respective short circuit currents Isc of the respective light sensitive semiconductor cells are substantially equal. Accordingly, the short circuit current of the light sensitive semiconductor unit as a whole is also Isc. By designing the short circuit current Isc high as shown in the dotted line in FIG. 4, there can be obtained a high operating voltage Vop1 against the load having a load resistance R 1 without causing the operating voltage to be lowered to Vop2 as occurred in the prior art as shown in the real line in FIG. 4. Therefore, it is an advantage of the present invention that a high operating voltage can be obtained for the light sensitive semiconductor unit 6 of the same size compared to the conventional light sensitive semiconductor unit.

Figure 9:
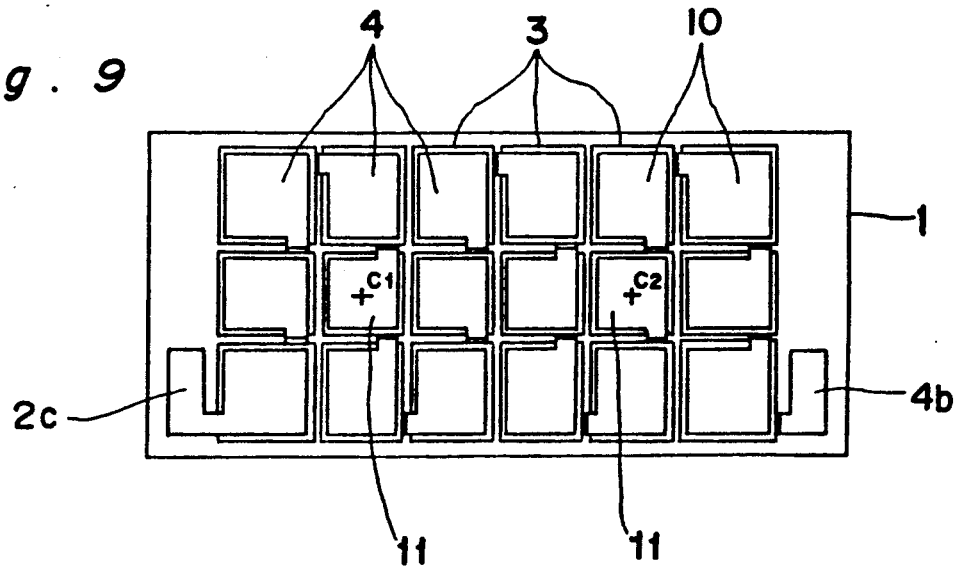
FIG. 9 is a top plan view of a further example of the light sensitive semiconductor unit according to the present invention.

FIG. 9 shows a further embodiment of the light sensitive semiconductor device according to the present invention in which two light sources such as LEDs are used for projecting the light to the light sensitive semiconductor unit. In the embodiment shown in FIG. 9, the light sensitive semiconductor cells 11 of which light receiving area is smallest are respectively disposed at the positions C1 and C2 on the substrate 1. The light sensitive semiconductor cells 10 of which the light receiving area is larger than that of the light sensitive semiconductor cell 11 are disposed around each of the light sensitive semiconductor cells 11. The respective light sensitive semiconductor cells 10 and 11 are formed in the same manner as shown in the forgoing embodiments and are electrically connected in series and the output voltage can be obtained from the terminals 2c and 4b. The light sensitive semiconductor unit as shown in FIG. 9 is used in such a manner that the light axis of each of two LEDs is aligned with the center C1 and C2 of the light sensitive semiconductor unit shown in FIG. 9. Since the light receiving area of the light sensitive semiconductor units are increased as the intensity of the light incident t the light sensitive semiconductor cells decreases, the same advantage obtained in the embodiments shown in FIGS. 1a to 1c and FIG. 8 can be obtained.

Although the light sensitive semiconductor units mentioned above are used by projecting the light from the substrate 1, it may be possible to project the light from the upper electrodes through the protection layer 5. However, in this case, the upper electrodes 4 and the protection layer 5 are made by transparent material.

As the light sensitive semiconductor member, there may be used single crystal silicon semiconductor or poly silicon semiconductor. The size of the respective light sensitive semiconductor cells may be 0.5 mm×0.5 mm although the above size is not the limiting value.

Moreover, in the present invention, the light receiving area or size of the light sensitive semiconductor cells may be changed everywhere corresponding to the intensity of the received light.

As mentioned above, according to the present invention, since the light receiving area of the respective light sensitive semiconductor cells are changed in such a manner that the light receiving area is small for the light sensitive semiconductor cell disposed at a position where the light intensity is high and the light receiving area is large for the light sensitive semiconductor cell disposed at a position where the light intensity is low, it is possible to make the output electric power especially the short circuit output current of the respective light sensitive semiconductor cells uniform, whereby a high short circuit current can be obtained even if the respective light sensitive semiconductor cells are connected in series. Therefore in order to obtain the same short circuit current, it is possible to decrease the size of the light sensitive semiconductor device as compared to the conventional light sensitive semiconductor device, and the cost for manufacturing the light sensitive semiconductor device may be decreased.

Therefore, a small sized optical relay or optical switch can be provided by combining one or more light sources and the light sensitive semiconductor unit according to the present invention.

What is claimed is:

1. A light sensitive semiconductor unit comprising a plurality of light sensitive semiconductor cells formed on a common substrate for generating electrical output from received light, a number of said light sensitive semiconductor cells being connected in series, wherein the light sensitive semiconductor cells have differing light receiving areas, the cells being arranged so that a cell of smallest light receiving area is located to receive the highest intensity of incident light and a cell of largest light receiving area is located to receive the lowest intensity of incident light, such that an output of each of the light sensitive semiconductor cells is substantially the same.

2. The light sensitive semiconductor unit according to claim 1, wherein the light sensitive semiconductor cells have a rectangular shape and are arranged on the substrate in a matrix such that at least one light sensitive semiconductor cell disposed at a central portion has a smallest light receiving area, and the light receiving area of the light sensitive semiconductor cells disposed around the at least one central light sensitive semiconductor cell increases as the position of the light sensitive semiconductor cell is farther from the at least one central light sensitive semiconductor cell.

3. The light sensitive semiconductor unit according to claim 1, wherein the light sensitive semiconductor cells have a sector shape and are disposed in a coaxial manner to form a round shape such that at least one light sensitive semiconductor cell disposed at a central portion has a smallest light receiving area, and the light receiving area of the light sensitive semiconductor cells disposed around the at least one central light sensitive semiconductor cell increases as the position of the light sensitive semiconductor cell is farther from the at least one central light sensitive semiconductor cell.

4. The light sensitive semiconductor unit according to claim 1, wherein two light sensitive semiconductor cells which have the smallest light receiving area are disposed at separate positions on the substrate, and a plurality of light sensitive semiconductor cells having increased light receiving area are disposed around said two light sensitive semiconductor cells in a matrix.

5. The light sensitive semiconductor unit according to claim 1, wherein two light sensitive semiconductor cells which have the smallest light receiving area are disposed at nonadjacent positions on the substrate, and a plurality of light sensitive semiconductor cells having increased light receiving area are disposed around each of said two light sensitive semiconductor cells in a matrix.

6. The light sensitive semiconductor unit according to claim 1, wherein at least one light sensitive semiconductor cell having a smallest light receiving area is disposed at a central portion of the substrate and arranged such that the central portion has a round shape, and wherein outer light sensitive semiconductor cells having an arcuate shape are disposed around the at least one central light sensitive semiconductor cell in a coaxial manner to form rings around the central portion, the light receiving area of said outer cells increasing as the position of an outer cell is farther from the central portion.

* * * * *